United States Patent
Combs et al.

(10) Patent No.: US 6,700,800 B2
(45) Date of Patent: Mar. 2, 2004

(54) RETAINER FOR CIRCUIT BOARD ASSEMBLY AND METHOD FOR USING THE SAME

(75) Inventors: Christopher Combs, Portland, OR (US); Arjang Fartash, Aloha, OR (US); Tom E. Pearson, Beaverton, OR (US); Raiyomand F. Aspandiar, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/173,342

(22) Filed: Jun. 14, 2002

(65) Prior Publication Data

US 2003/0231481 A1 Dec. 18, 2003

(51) Int. Cl.$^7$ ................................................ H02B 1/01
(52) U.S. Cl. ........................ 361/825; 361/807; 174/260
(58) Field of Search ................. 361/760, 763, 361/785, 786, 791, 807, 809, 810, 825; 174/260–267

(56) References Cited

U.S. PATENT DOCUMENTS

| | | | | |
|---|---|---|---|---|
| 3,670,409 A | * | 6/1972 | Reimer | 29/853 |
| 4,620,757 A | * | 11/1986 | Thevenaz | 439/733.1 |
| 4,950,173 A | * | 8/1990 | Minemura et al. | 439/82 |
| 5,415,565 A | * | 5/1995 | Mosquera | 439/567 |
| 5,473,813 A | * | 12/1995 | Chobot et al. | 29/837 |
| 5,541,839 A | * | 7/1996 | Mitzkus et al. | 244/3.16 |
| 6,521,842 B2 | * | 2/2003 | Brinthaupt et al. | 174/252 |

* cited by examiner

Primary Examiner—David Martin
Assistant Examiner—Thanh S. Phan
(74) Attorney, Agent, or Firm—Blakely, Sokoloff, Taylor & Zafman LLP

(57) ABSTRACT

A retainer for a circuit board and method for using the same are provided. In one embodiment, a circuit board assembly includes a circuit board, an electronic component, a plurality of electric contacts between the circuit board and the electronic component, and a retainer. The retainer has a first component secured to the circuit board and a second component secured to the electronic component. The retainer allows for movement of the electronic component in a first direction towards the circuit board while simultaneously preventing movement of the circuit board and the electronic component in a second direction away from one another when the electric contacts melt.

9 Claims, 5 Drawing Sheets

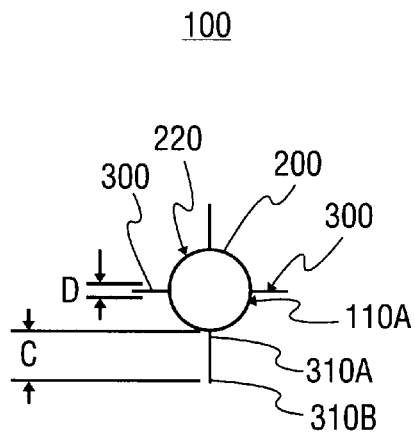
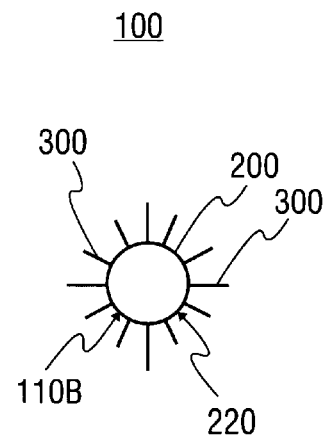
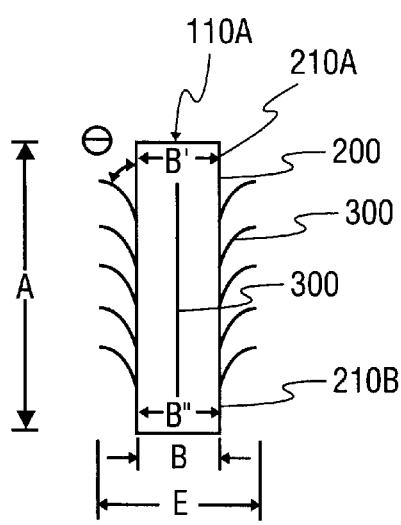
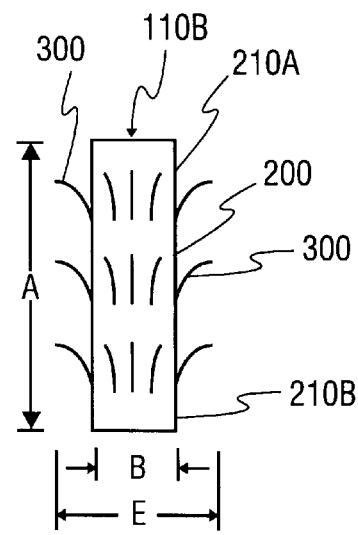
FIG. 1A  FIG. 1B

RETAINER FOR CIRCUIT BOARD ASSEMBLY AND METHOD FOR USING THE SAME

FIELD

Embodiments of the present invention relate generally to printed circuit board assembly and, more particularly, to a retainer to retain an electronic component on a circuit board.

BACKGROUND

Printed circuit boards (PCBs) generally comprise a composite of organic and inorganic materials with external and internal metal traces, permitting assembled electronic components to be mechanically supported and electrically connected. Electronic components are assembled on at least one of the outer metal layers of the typical printed circuit board. On a single-sided printed circuit board, for example, electronic components are assembled on only one of the outer metal layers, referred to as the primary side of the printed circuit board. The opposite side of such a printed circuit board is called the secondary side.

After the electrical components have been positioned on the primary side via, for example, a pick-and-place machine (not shown), the single-sided printed circuit board typically undergoes a single soldering stage. Alternatively, electronic components can be assembled on both the primary side and the secondary side of a double-sided printed circuit board. To assemble electrical components on both sides, double-sided printed circuit boards must typically undergo multiple soldering stages.

Today, a significant number of electrical components are surface mounted to printed circuit boards. Surface-mounted components are positioned on metal pads or lands, which are formed on the outer metal layers of the printed circuit board, by applying solder paste to the relevant lands before positioning the surface-mounted components. The solder paste liquefies during a manufacturing stage called solder reflow (or more simply reflow), and the surface tension of the liquefied solder enables the surface-mounted components to align with, and to couple with, the relevant lands on the printed circuit board. Thus, when the solder cools and solidifies, the surface-mounted components are assembled on the printed circuit board.

To more efficiently utilize printed circuit board real estate, double-sided printed circuit boards are used with surface-mounted components assembled on both the primary side and the secondary side of the printed circuit board. The surface-mounted components first are assembled, i.e. positioned and reflowed, on an upward-facing side, such as the primary side, of the printed circuit board. The double-sided printed circuit board then is flipped over such that the opposite side, such as the secondary side, faces upwardly, and additional surface-mounted components are positioned on the secondary side. After the additional surface-mounted components have been positioned, the double-sided printed circuit board undergoes a second reflow stage to liquefy the solder on the upward-facing secondary side. During the second reflow stage, however, the entire double-sided printed circuit board is heated, and the solder on the primary side of the double-sided printed circuit board also liquefies with the surface-mounted components assembled on the primary side facing downwardly in opposition of gravity.

Unlike through-hole components, most surface-mounted components do not include any retaining devices, such as through-hole conductive pins and/or locating posts, to maintain component placement during the second reflow stage. Although adequate to maintain component placement on the upward-facing secondary side of the double-sided printed circuit board, the surface tension of the liquefied solder during the second reflow stage generally is insufficient to maintain component placement for heavier surface-mounted components previously assembled on the downward-facing primary side. Due to the effects of gravity, one or more of the surface-mounted components previously assembled on the downward-facing primary side can separate from or become misaligned with the relevant lands when the solder again liquefies during the second reflow stage.

To retain these larger surface-mounted components, adhesives presently are applied to the double-sided printed circuit board before the surface-mounted components are positioned. Automatic adhesive application, however, requires additional equipment, which must be purchased and maintained; whereas, manual application of the adhesive results in unpredictable quality and increased labor expenses.

BRIEF DESCRIPTION OF THE DRAWINGS

The present invention is illustrated by way of example, and not limitation, in the figures of the accompanying drawings in which:

FIG. 1a is an illustration of one embodiment of a bristled retainer for double-sided printed circuit board assemblies;

FIG. 1b is an illustration of an alternative embodiment of a bristled retainer for double-sided printed circuit board assemblies;

DETAILED DESCRIPTION

Figure 2:
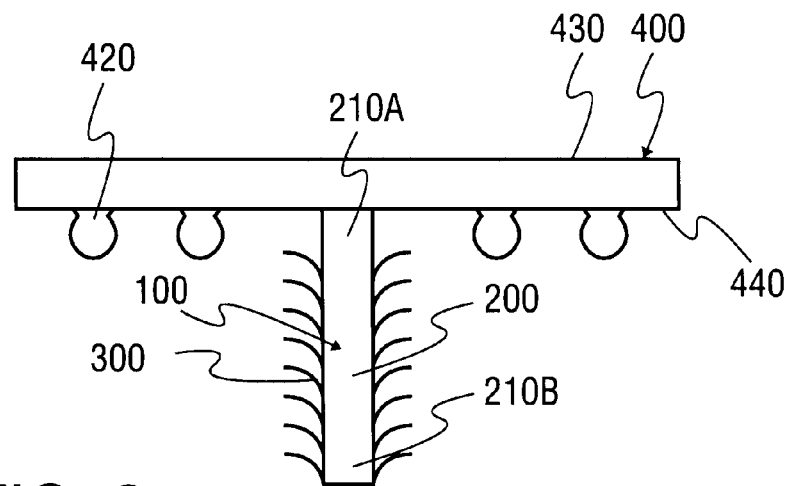
FIG. 2 illustrates the retainer of FIG. 1a coupled with a component prior to placement onto the double-sided printed circuit board.

A retainer for a circuit board assembly and method for using the same are described. Reference will now be made in detail to the embodiments of the invention, examples of which are illustrated in the accompanying drawings. While the invention will be described in conjunction with numerous embodiments, it will be understood that they are not intended to limit the invention to these embodiments. On the contrary, embodiments of the invention are intended to cover alternative, modifications and equivalents, which may be included within the spirit and scope of embodiments of the invention as defined by the claims.

Single Retainer

FIG. 1a is an illustration of one embodiment of a bristled retainer for double-sided printed circuit board assemblies. The retainer 100 includes a first component and a second component. The first component is secured to the circuit board while the second component is secured to an electronic component. There are electrical contacts between the electronic component and circuit board. The retainer allows for movement of the electronic component in a first direction towards the circuit board while simultaneously preventing movement of the circuit board and the electronic component in a second direction away from one another when the electric contacts melt.

In one embodiment, the first component is the retainer member 100 and the second component is a connector. In one embodiment, as seen in FIG. 1a, the connector is a set of bristles 300 attached to the retainer member 200. In alternative embodiments, the connector may be another type of mechanical assembly.

The retainer member 200 can be manufactured with any size and shape, such as a cylindrical body as illustrated in FIGS. 1a and 1b, and by any manufacturing process known in the art, such as stamping or molding. The retainer member 200 is formed from a retainer material, which can comprise any type of material, such as a plastic, a ceramic, or a metal. In one embodiment, the retainer material comprises a liquid crystal polymer (LCP) plastic. The retainer material forming the retainer member 200 is to remain chemically and/or functionally stable when exposed to temperatures that are much higher than a melting point of solder or a typical solder reflow temperature range used in surface-mount (SMT) manufacturing. The solder reflow temperature may range between 180° C. and 240° C.

As illustrated, the retainer member 200 has a length A and a cross-section B, both of which can be of any suitable dimension. The retainer member 200 has a circumference 220 and includes a proximal end region 210a and an oppositely disposed distal end region 210b.

In one embodiment, the retainer member 200 has a uniform cross-sections B. In an alternative embodiment, the cross-section B' of the proximal end region 210a of the retainer member 200 can be larger than, equal to, or smaller than a cross-section B" of the distal end region 210b.

The plurality of bristles 300 can be manufactured from any type of flexible or semi-rigid material, such as a plastic or a metal. For example, a liquid crystal polymer (LCP) plastic is a suitable plastic material for the bristles 300. In one embodiment, a suitable metal material is a non-wetting and resilient metal or alloy material such as spring steel. The bristles 300 are to remain chemically and/or functionally stable when exposed to temperatures that are much higher than the melting point of solder or the typical solder reflow temperatures. Each of the bristles 300 can be formed in any size and shape and by any process, such as stamping or molding.

As shown in FIG. 1a, each bristle 300 has a length C and a cross-sections D, both of which can be of any suitable dimension. The length C of the bristle 300 ranges between about 0.040 and 0.060 inches with a nominal length of approximately 0.050 inches. If the bristles 300 are formed from a metal such as a steel or copper alloy, the cross-section D may have a nominal width approximately between about 0.003 and 0.006 inches for each bristle 300. For plastic bristles 300, the nominal width of the cross-section D for each bristle 300 ranges approximately between about 0.007 and 0.010 inches.

In one embodiment, the length C, the cross-section D, and the composition of the flexible material can be uniform among the bristles 300. In an alternative embodiment, the length C, the cross-section D, and the composition of the flexible material can vary among the bristles 300.

Each bristle 300 includes a proximal end region 310a and a distal end region 310b, as shown in FIG. 1a. The bristles 300 are coupled with the circumference 220 of the retainer member 200 via their proximal end regions 310a. Each bristle 300 extends radially from the retainer member 200.

The bristles 300 can be coupled with the retainer member 200 in any manner, including via an adhesive, a clamp, and/or a fastener. Alternatively, or additionally, the bristles 300 can be stitched into the retainer member 200. The retainer member 200, for example, can include two opposing longitudinal portions (not shown), and the bristles 300 can be secured between, and extend from, the opposing longitudinal portions similar to a pipe cleaner. The bristles 300 also can be formed onto the retainer member 200 by, for example, molding or shaving the retainer member 200. Stated somewhat differently, the retainer 200 and the bristles 300 can be formed from the same material and can comprise a single unit.

In one embodiment, the bristles 300 can extend from the circumference 220 of the retainer member 200 at a pre-selected angle $\theta$, which can vary or be uniform among the bristles 300. The pre-selected angle $\theta$ can be any angle. In one embodiment, the angle ranges approximately between about 30° and 45°. When the bristles 300 are formed on, or coupled with, the retainer member 200, the retainer 100 has an overall cross-section E, which can be of any suitable dimension.

In one embodiment, the bristles 300 can also be formed on, or coupled with, the circumference 220 of the retainer member 200 in any arrangement. For example, the bristles 300 can be arranged in columns along the length A as illustrated by the retainer 110a shown in FIG. 1a, in rows around the circumference 220 as illustrated by the retainer 110b shown in FIG. 1b, and/or randomly.

In one embodiment, each bristle 300 is arranged to be in opposition with one or more bristles 300. For example, at a predetermined position along the length A of the retainer member 200, four bristles 300 in opposition can be positioned approximately 90° around the circumference 220 as illustrated in FIG. 1a. A collection of at least three bristles 300 is located at each predetermined position along the length A of the retainer member 200, and each bristle 300 in the collection is equally spaced around the circumference 220. The bristles 300 may be symmetrically disposed about the circumference 220 of the retainer member 200. The bristles 300 can be distributed along the length A of the retainer member 200 as desired such that the bristles 300 within a pre selected column overlap, as shown in FIG. 1a, and/or do not overlap, as illustrated in FIG. 1b.

Turning to FIG. 2, the retainer 100, in operation, is coupled with a component 400 via the proximal end region 210a of the retainer member 200. The component 400 can be any type of electrical and/or electronic component, such as an integrated circuit die, a socket, or a connector. In one embodiment, the component 400 may be a surface-mounted component. The surface-mounted component may be manufactured in a ball-grid array (BGA), a quad flat pack (QFP), or a thin small outline package (TSOP). It will be appreciated, however, that the retainer 100 is compatible with components 400 manufactured in any type of package, including through-hole packages.

The component 400 includes one or more electrical connections 420, such as leads and/or pads, which are electrically isolated and supported by a component package 430. The component package 430 can be formed from any type of electronic packaging material, such as a plastic, a ceramic, or a metal. Each electrical connection 420 is coupled to the component 400 with one or more relevant mounting surfaces 520 on one side. A relevant mounting surface may be a solder pad or land. The side may be a primary side 530 or a secondary side 540 of a printed circuit board 500.

In one embodiment, the retainer member 200 is centrally positioned such that a mass or size of the component 400 is equally distributed about the retainer 100. The retainer member 200 can be coupled with, or formed on, the component package 430 in any manner known in the art. For example, the retainer member 200 may be coupled with the component package via an adhesive, a clamp, and/or a fastener. In an alternative embodiment, the retainer member 200 can be formed on the component package 430 when the component 400 is produced. The component package 430 and the retainer member 200 can be formed from the same material and/or can comprise a single unit.

In one embodiment, the retainer member 200 can be coupled with the component package 430 before the component 400 has been assembled onto the printed circuit board 500. For example, the retainer member 200 can be coupled with the component package 430 during a separate manufacturing stage or during pre-assembly preparation of the component 400.

In an alternative embodiment, the retainer member 200 can also be coupled with the component package 430 after the component 400 has been assembled onto the printed circuit board 500. An automated insertion tool or machine (not shown) can be used to position and couple the retainer 100 with the component 400.

The retainer member 200 can extend from any portion of the component package 430. The retainer member 200 extends from a surface 440 of the component package 430 that is adjacent to the printed circuit board 500 when the component 400 is positioned and assembled.

The printed circuit board 500 includes an opening 510 that is defined by at least one inner surface 550 of the printed circuit board 500. The opening 510 can extend completely, as illustrated in FIG. 2 in one embodiment. In an alternative embodiment, the opening 510 can extend partially through the printed circuit board 500.

The opening 510 receives the distal end region 210b of the retainer member 200. In one embodiment, the opening is a non-plated through-hole. In alternative embodiments, the opening 510 may be any type of opening, such as a via and/or a plated through-hole.

The opening 510 may be formed with any cross-section F that is sized greater than the cross-section B of the retainer member 200 and less than or equal to the overall cross-section E of the retainer 100. For example, if the cross-section B of the retainer member 200 has a diameter that is equal to approximately 0.040 inches and the overall cross-section E of the retainer 100 has a diameter of approximately 0.120 inches, a diameter of the cross-section F can range approximately between about 0.040 and 0.120 inches. In one embodiment, the diameter of the cross-section F in the foregoing example is equal to 0.100 inches.

Figure 3:
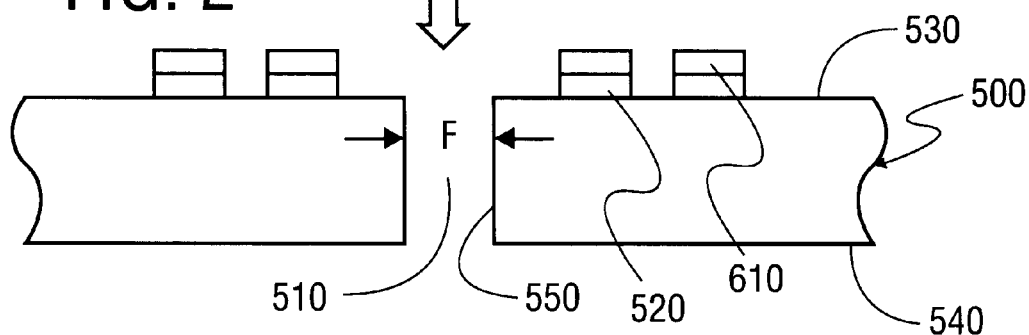
FIG. 3 illustrates the retainer of FIG. 2 after the component has been positioned onto the double-sided printed circuit board.
Figure 3:
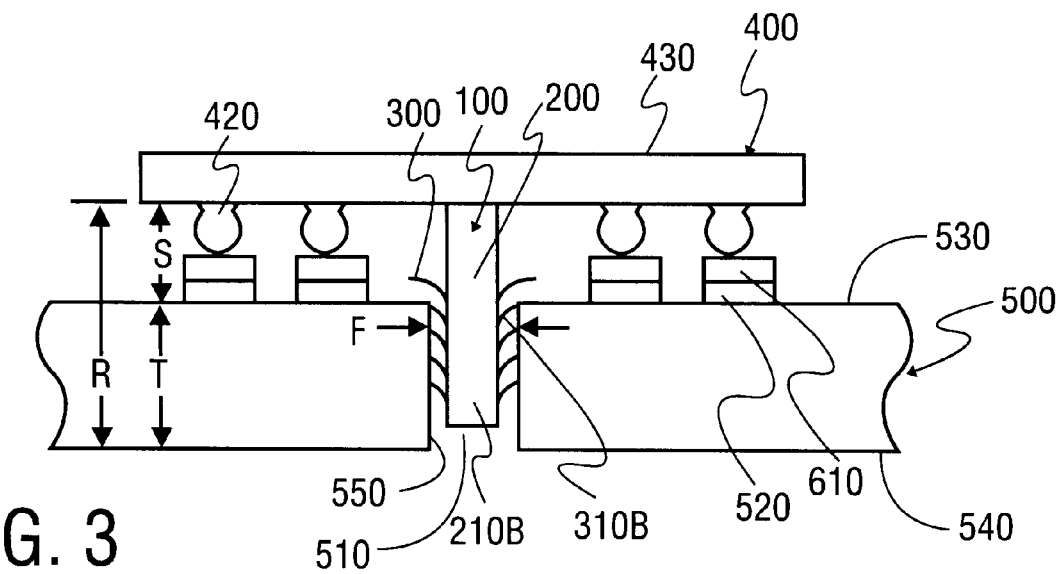

As shown in FIG. 3, the component 400 is positioned onto the relevant mounting surfaces 520 on one side such as the primary side 530 of the printed circuit board 500. The primary side 530 is a side of the printed circuit board 500 that is first populated and reflowed. The secondary side 540 is opposite the primary side 530, being populated and reflowed after the primary side 530.

The component 400 can be positioned onto the primary side 530 by any manner known in the art, such as a pick-and-place machine (not shown). For purposes of illustration, the component 400 is shown and described as being positioned onto the primary side 530. However, it will be appreciated that the component 400 can be positioned onto either side of the printed circuit board 500, including the secondary side 540.

Figure 4:
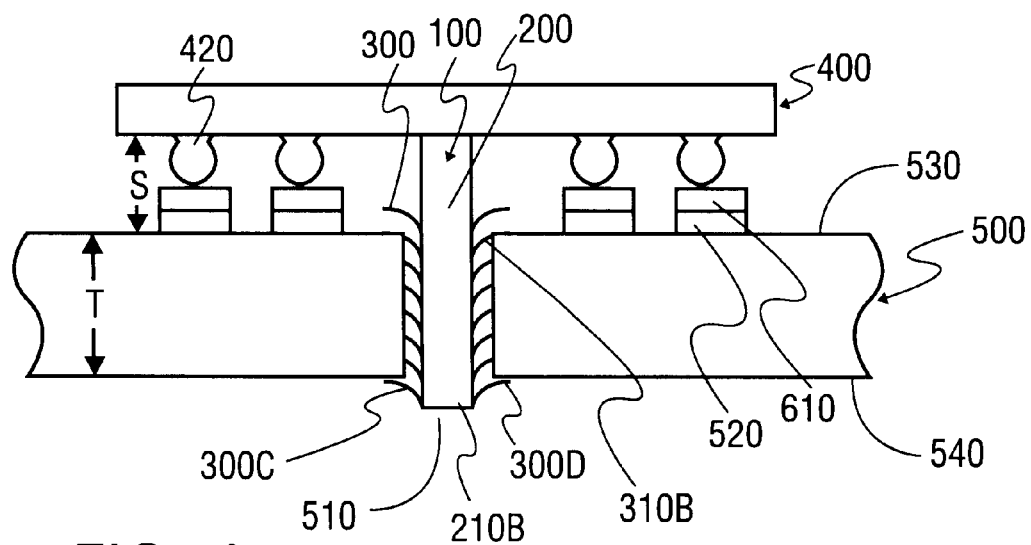
FIG. 4 illustrates an alternative embodiment of the retainer of FIG. 2 after the component has been positioned onto the double-sided printed circuit board.

In one embodiment, when the component 400 is properly positioned onto the printed circuit board 500, the retainer member 200 is in axial alignment with the opening 510. The distal end region 210b of the retainer member 200 is received by the opening 510. The distal end region 210b can extend partially, as shown in FIG. 3, or entirely, as illustrated in FIG. 4, through the opening 510. Stated somewhat differently, the length A (shown in FIG. 1a) of the retainer member 200 can be greater than, equal to, or less than a distance R that is the sum of a standoff distance S and a thickness T of the printed circuit board 500. The standoff distance S is the distance between the surface 440 of the component package 430 and the primary side 530 of the printed circuit board 500.

The thickness T of the printed circuit board 500 can be any thickness. In different embodiments, the printed circuit board has a thickness of approximately 0.062 inches, 0.050 inches, 0.040 inches, or 0.012 inches. To inhibit subsequent interference between the retainer 100 and a tool (not shown) for applying solder paste to the secondary side 540 of the printed circuit board 500, the distal end region 210b is disposed within the opening 510. For example, for a printed circuit board 500 with the thickness T of approximately 0.062 inches, the retainer member 200 can have the length A of approximately 0.075 inches when the standoff distance S between the component package 430 and the primary side 530 is approximately 0.025 inches. In one embodiment, the distal end region 210b is recessed in the opening 510 by at least 0.010 inches. In an alternative embodiment, the distal end region 210b is recessed in the opening 510 by approximately 0.012 inches.

As the distal end region 210b is received by the opening 510, the distal end regions 310b of some or all of the bristles 300 also are received by the opening 510 and contact the inner surface 550 adjacent to the primary side 530. Since the retainer 100 has an overall cross-section E (shown in FIG. 1a) that is greater than or equal to the cross-section F of the opening 510, the bristles 300 are compressed upon contacting the inner surface 550 adjacent to the primary side 530. As the bristles 300 resist the compression, the distal end regions 310b press against and engage the inner surface 550 of the opening 510.

In one embodiment, the distal end regions 310b frictionally engage the inner surface 550. In alternative embodiments, the distal end regions 310b can engage the inner surface 550 in any manner, such as via an adhesive.

Additional distal end regions 310b of the bristles 300 can engage the inner surface 550 as the distal end region 210b of the retainer member 200 continues to be received by the opening 510. The distal end regions 310b continue to engage the inner surface 550 when the component 400 is properly positioned onto the printed circuit board 500.

The length C (shown in FIG. 1a) and/or the pre-selected angle θ (shown in FIG. 1a) of each of the bristles 300 are suitably chosen to reduce an insertion force to insert the retainer 100 into the opening 510. For example, the length C can be uniform or vary among the bristles 300. The shorter bristles 300 assist in aligning of the retainer member 200 with the opening 510. The longer bristles 300 engage the inner surface 550. The selection of the length C and the pre-selected angle θ can depend on the composition of the flexible material and/or the cross-section D (shown in FIG. 1a) of the bristles 300.

As discussed above, in one embodiment, the distal end region 210b of the retainer member 200 is disposed within the opening 510. In an alternative embodiment, the distal end region 210b of the retainer member 200 can pass completely through and extend from the opening 510 as shown in FIG. 4. If the distal end region 210b extends from the opening 510, some of the bristles 300, such as bristles 300c and 300d, also extend through the opening 510 and, being resilient, re-expand to the pre-insertion overall cross-section E (shown in FIG. 1a). Having the overall cross-section E that is greater than or equal to the cross-section F of the opening 510, the distal end regions 310b of the bristles 300c and 300d then are disposed adjacent to and can contact the secondary side 540 adjacent to the opening 510. Accordingly, the bristles 300c and 300d can press against and can engage the secondary side 540 adjacent to the opening 510, enhancing the engagement between the bristles 300 and the printed circuit board 500.

Returning to FIG. 3, once positioned onto the primary side 530, the component 400 and the additional components, if any, are held in place via the solder paste 610 and/or gravity. They are subsequently assembled onto the primary side 530. The component 400 and the additional components can be assembled onto the primary side 530 via any manner known in the relevant art, including wave soldering, hand soldering, convection reflow, and/or infrared (IR) reflow.

In one embodiment, during convection reflow, the printed circuit board 500, the component 400, the retainer 100, and the additional components begin to heat. The ambient temperature surrounding the printed circuit board 500 increases from room temperature and approaches the typical solder reflow temperature. At the solder reflow temperature, the solder paste 610 can begin to liquefy. As the solder paste 610 begins to liquefy, a surface tension of the liquefied solder paste 610 enables the component 400 to align with and couple with the relevant mounting surfaces 520 on the primary side 530. The bristles 300 are sufficiently flexible to permit the surface tension of the liquefied solder paste 610 to guide the alignment of the component 400 with the relevant mounting surfaces 520 during assembly.

Figure 5:
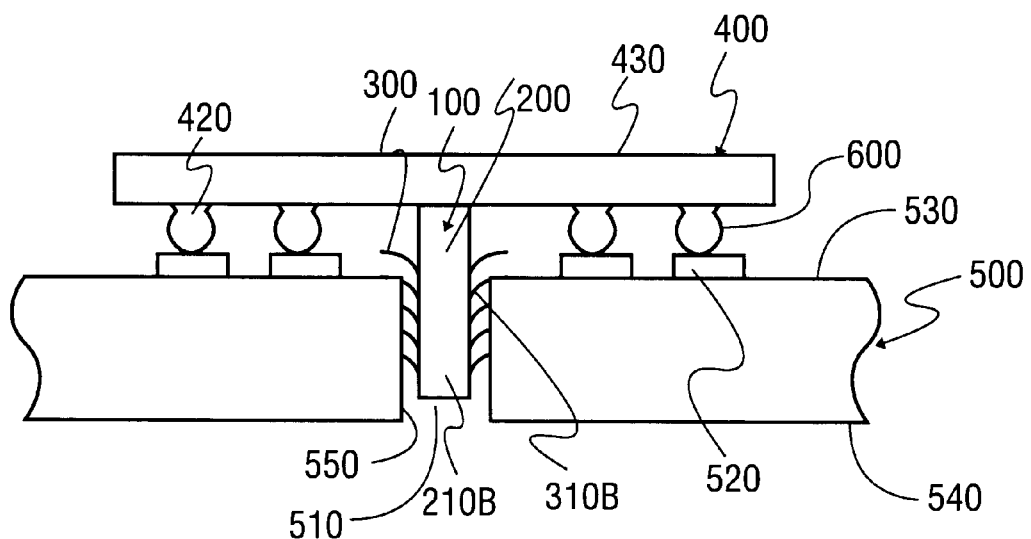
FIG. 5 illustrates the retainer of FIG. 2 after the component has been assembled onto the double-sided printed circuit board.

Once the component 400 is aligned with the relevant mounting surfaces 520 on the primary side 530, the liquefied solder paste 610 forms solder connections 600, as shown in FIG. 5, coupling each of the electrical connections 420 with the relevant mounting surfaces 520. After convection reflow, the solder connections 600 cool and solidify, and the component 400 is properly assembled onto the printed circuit board 500.

After the component 400 and the additional components are assembled onto the primary side 530, the printed circuit board 500 can be inverted to facilitate the positioning of one or more other components (not shown) onto the secondary side 540. The other components are each positioned onto one or more other relevant mounting surfaces (not shown) on the secondary side 540 by any manner known in the art, such as a pick-and-place machine (not shown), as was previously discussed in more detail above.

During the second convection reflow stage, the printed circuit board 500, along with the inverted component 400, the retainer 100, and the other components, begins to heat. To liquefy the solder paste associated with the other components, the ambient temperature surrounding the printed circuit board 500 approaches the typical solder reflow temperature. At this temperature, some or all of the solder connections 600 associated with the inverted component 400 also can soften and/or liquefy.

Since the retainer material of the retainer member 200 and the flexible material of the bristles 300 can withstand decomposition and/or remain functionally stable at temperatures exceeding the typical solder reflow temperatures, the retainer 100 remains functionally stable during the second convection reflow stage. The retainer material and the flexible material inhibit the retainer 100 from deforming or softening due to heat exposure. Accordingly, the engagement between the bristles 300 and the inner surface 550 is maintained as some or all of the solder connections 600 of the inverted component 400 liquefy.

As the solder connections 600 liquefy during the second convection reflow stage, the inverted component 400 is supported and coupled with the printed circuit board 500 via the retainer 100. In addition to reducing the insertion force of the retainer 100 into the opening 510, the length C (shown in FIG. 1a) and/or the preselected angle θ (shown in FIG. 1a) of each of the bristles 300 are suitably chosen to resist removal of the retainer 100 from the opening 510.

As the solder connections 600 liquefy, the bristles 300 continue to engage the inner surface 550 thereby maintaining the position of the inverted component 400 on the relevant mounting surfaces 520. Accordingly, the inverted component 400 is inhibited from separating from the printed circuit board 500 and/or from becoming misaligned with the relevant mounting surfaces 520. Thus, when the solder connections 600 cool and again solidify after the second convection reflow stage, the component 400 remains assembled on the printed circuit board 500. The other components may therefore be assembled onto the secondary side 540 while the inverted component 400, supported by the retainer 100, remains properly assembled onto the primary side 530.

As was previously mentioned, the retainer 100 alternatively can be coupled with the component package 430 after the component 400 has been assembled onto the printed circuit board 500. In one embodiment, the opening 510 in the printed circuit board 500 is disposed adjacent to the surface 440 of the component package 430. In an alternative embodiment, the opening 510 in the printed circuit board 500 is disposed adjacent to the assembled component 400 and/or the relevant mounting surfaces 520.

The proximal end region 210a (shown in FIG. 1a) of the retainer member 200 is received by the opening 510 and is positioned adjacent to the component package 430. For the retainer member 200 to be received by the opening 510, the bristles 300 can be pre-compressed in any manner, such as by disposing the retainer member 200 and the bristles 300 within a removable sheath (not shown) forming an internal passage (not shown). When disposed within the internal passage of the sheath, the bristles 300 are compressed such that the overall cross-section E (shown in FIG. 1a) is reduced to less than the cross-section F of the opening 510. Accordingly, the proximal end region 210a of the retainer member 200 can be received by the opening 510 and positioned adjacent to and coupled with the component package 430. When the removable sheath is subsequently removed from the bristles 300, the distal end regions 310*b* of some or all of the bristles 300 resists the pre-compression and re-expands, pressing against and engaging the inner surface 550.

In one embodiment, one or more of the distal end regions 310*b* can be treated to enhance the engagement between the distal end regions 310*b* of the bristles 300 and the inner surface 550. The engagement can be enhanced by any manner known in the art. For example, the distal end regions 310*b* can be roughened by any process such as scoring. The distal end regions 310*b* also can be angle cut and/or provided with a conforming material (not shown), such as a spongy material.

To further improve the engagement of the inner surface 550 by the distal end regions 310*b*, the pre-selected angle θ can be varied among the bristles 300. In addition, the inner surface 550 can be treated, such as by roughening, to enhance the engagement with the distal end regions 310*b*. The inner surface 550 can be roughened by any manner known in the art such as scoring or notching. Alternatively, or additionally, a conforming material (not shown), such as a spongy material, can be coupled with the inner surface 550 to engage the distal end regions 310*b*.

In one embodiment, a sleeve (not shown) with an internal surface (not shown) that is, for example, roughened or coupled with a conforming material can be disposed within the opening 510 and coupled with the inner surface 550. The sleeve can be formed from a rough or conforming material, or the internal surface of the sleeve can be roughened or coupled with the conforming material in any manner known in the art.

Multiple Retainers

Figure 6:
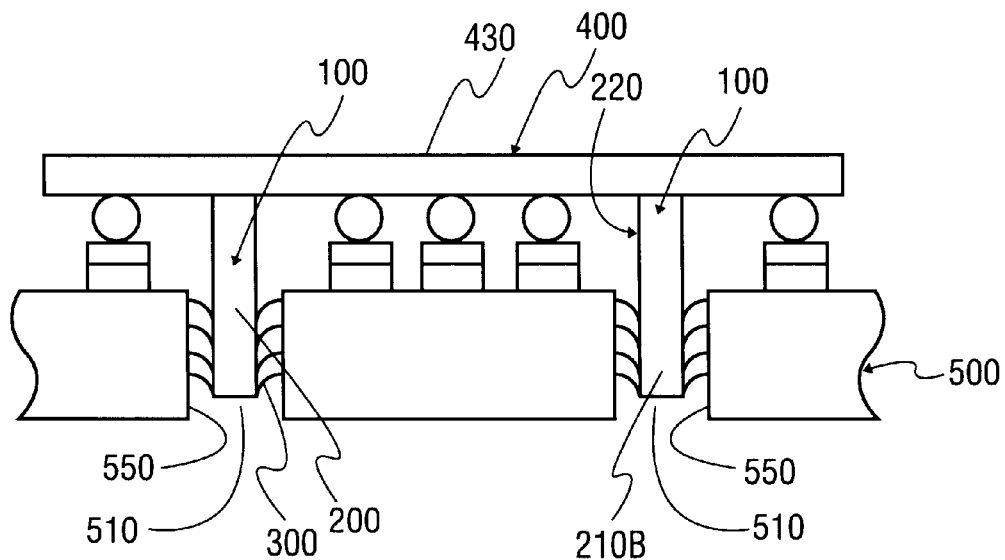
FIG. 6 is an illustration of another alternative embodiment of a bristled retainer for double-sided printed circuit board assemblies.

Although a single retainer 100 has been previously shown and described as being coupled with a component 400, in alternative embodiments many retainers 100 may be used with the component 400 as shown in FIG. 6. For example, the retainers 100 may be used to adequately support larger and/or heavier components 400 that are assembled onto a printed circuit board 500, which are subsequently inverted and reflowed.

The retainers 100 each includes a retainer member 200 and bristles 300 as were described in more detail above. Each of the retainer members 200 can be formed with differing and/or uniform dimensions and retainer materials. Similarly, each of the bristles 300 can extend at differing and/or uniform pre-selected angles θ (shown in FIG. 1*a*) from a circumference 220 of the relevant retainer member 200 and can be formed with differing and/or uniform dimensions and flexible materials.

Each retainer member 200 is coupled with, and extends from, a component package 430 of the component 400. The retainer members 200 include distal end regions 210*b* that may be equally distributed such that the mass of the component 400 is equally distributed among the retainers 100.

Retainer With Multiple Sets of Bristles

Figure 7:
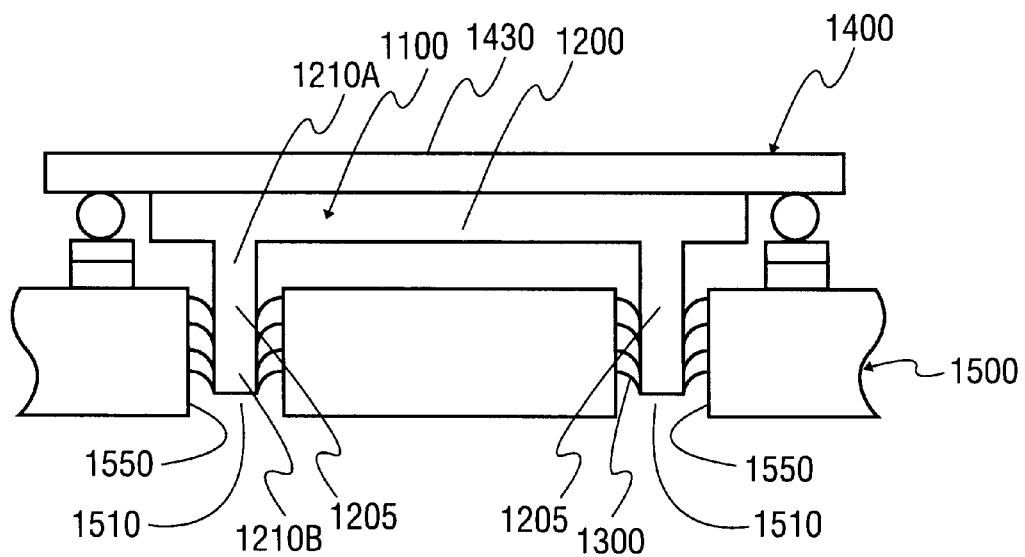
FIG. 7 is an illustration of another alternative embodiment of a bristled retainer for double-sided printed circuit board assemblies.

In one embodiment, the retainer 1100 can include a retainer member 1200 and more than one set of bristles 1300 as shown in FIG. 7. Such a retainer 1100 can be used to adequately support larger and/or heavier components 1400 that are assembled onto a printed circuit board 1500, which is subsequently inverted and reflowed.

The retainer member 1200 includes at least one coupling member 1205. In one embodiment, the coupling member 1205 has a circumference 1220 and includes a proximal end region 1210*a* and an oppositely disposed distal end region 1210*b*. Each bristle 1300 is coupled with the relevant coupling member 1205. Each coupling member 1205 can be coupled with the retainer member 1200 via the proximal end region 1210*a*.

In different embodiments, the retaining member 1200 and coupling member 1205 can be manufactured from the same or different materials. Each bristle 1300 can extend at a differing and/or uniform pre-selected angle θ (shown in FIG. 1*a*) from the circumference 1220 of the relevant coupling member 1205 and can be formed with differing and/or uniform dimensions and flexible materials. The retainer member 1200 is coupled with, and extends from, a component package 1430 of the component 1400.

The component 1400 is positioned and assembled onto the printed circuit board 1500 forming openings 1510, each being defined by an inner surface 1550. When the component 1400 is properly positioned onto the printed circuit board 1500, the coupling members 1205 are in axial alignment with and received by the plurality of openings 1510. Each bristle 1300 engages the inner surface 1550, defining the relevant opening 1510, and coupling the component 1400 with the printed circuit board 1500.

Retainer With Bristles on Inner Surface of Opening In Circuit Board

Figure 8:
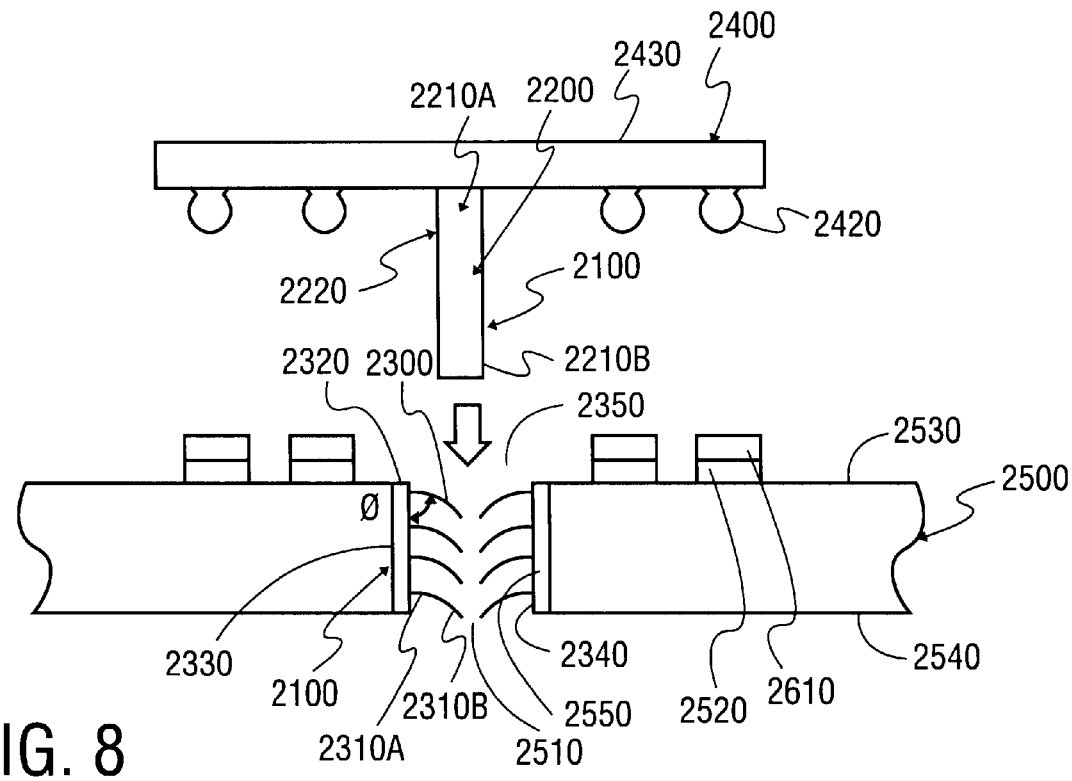
FIG. 8 is an illustration of another alternative embodiment of a bristled retainer for double-sided printed circuit board assemblies.

Another embodiment of the retainer 2100 is illustrated in FIG. 8. Here, the retainer 2100 includes a retainer member 2200 and bristles 2300. The retainer member 2200 is somewhat analogous to the retainer member 200 (shown in FIG. 1*a*). However, in FIG. 8, the bristles 2300 are coupled with one or more inner surfaces 2550 that define an opening 2510 formed in a printed circuit board 2500.

The retainer member 2200 has a proximal end region 2210*a*, an oppositely disposed distal end region 2210*b*, and a circumference 2220. The bristles 2300 are somewhat analogous with the previously-described bristles 300 shown in FIG. 1*a*.

Each bristle 2300 includes a proximal end region 2310*a* and a distal end region 2310*b*. Each bristle 2300 extends radially from the inner surface 2550 with a pre-selected length (not shown) and at a pre-selected angle φ which can vary and/or be uniform. The pre-selected angle φ can comprise any angle and in one embodiment ranges approximately between about 30° and 45°.

In one embodiment, each bristle 2300 is arranged to be in opposition with at least one of the other bristles 2300. For example, a collection of at least three bristles 2300 can be located at predetermined positions along a length (not shown) of the inner surface 2550, and each bristle 2300 can be equally spaced around a circumference (not shown) of the inner surface 2550. The bristles 2300 can be coupled with the inner surface 2550 via the proximal end region 2310*a* by any manner known in the art.

Bristle Carrier

In one embodiment, the bristles 2300 are coupled with the inner surface 2550 via a bristle carrier 2320. The bristle carrier 2320 can be manufactured from a carrier material. The bristle carrier 2320 can be formed in any suitable size and shape by any manufacturing process known in the relevant art. The carrier material can be any type of material, such as a plastic, a liquid crystal polymer (LCP) plastic, a ceramic, or a metal, that is well-known in the art and remains chemically and/or functionally stable when exposed to temperatures that are much higher than the melting point of solder or the typical solder reflow temperatures. In one embodiment, the carrier material comprises the same material as the flexible material of the bristles 2300. The bristle carrier 2320 and the bristles 2300 can be manufactured from the same material and/or comprise a single unit.

The bristle carrier 2320 is to be disposed within the opening 2510 of the printed circuit board 2500. The bristle carrier 2320 includes an exterior surface 2330 and an interior surface 2340, defining a channel 2350. The exterior surface 2330 is received by and coupled with the inner surface 2550 of the opening 2510 by any manner known in the art. An automated insertion tool or machine (not shown) can be used to insert the bristle carrier 2320 into the opening 2510 and to couple the bristle carrier 2320 with the inner surface 2550.

As discussed more fully above, each proximal end region 2310a of each bristle 2300 is coupled with, or formed on, the interior surface 2340 in any manner known in the art and extends radially at the pre-selected angle φ. The channel 2350 is suitably dimensioned to receive the distal end region 2210b of the retainer member 2200 and to position the bristles 2300 such that the distal end regions 2310b engage the circumference 2220 of the retainer member 2200.

As discussed more fully above, the retainer member 2200 is coupled with a component 2400 via the proximal end region 2210a in any manner known in the art. The retainer member 2200 can be coupled with the component 2400 at any time and is centrally positioned such that a mass or size of the component 2400 is equally distributed about the retainer 2100. The component 2400 can be positioned onto one or more relevant mounting surfaces 2520 on one side such as a primary side 2530 of the printed circuit board 2500 as described in above.

Figure 9:
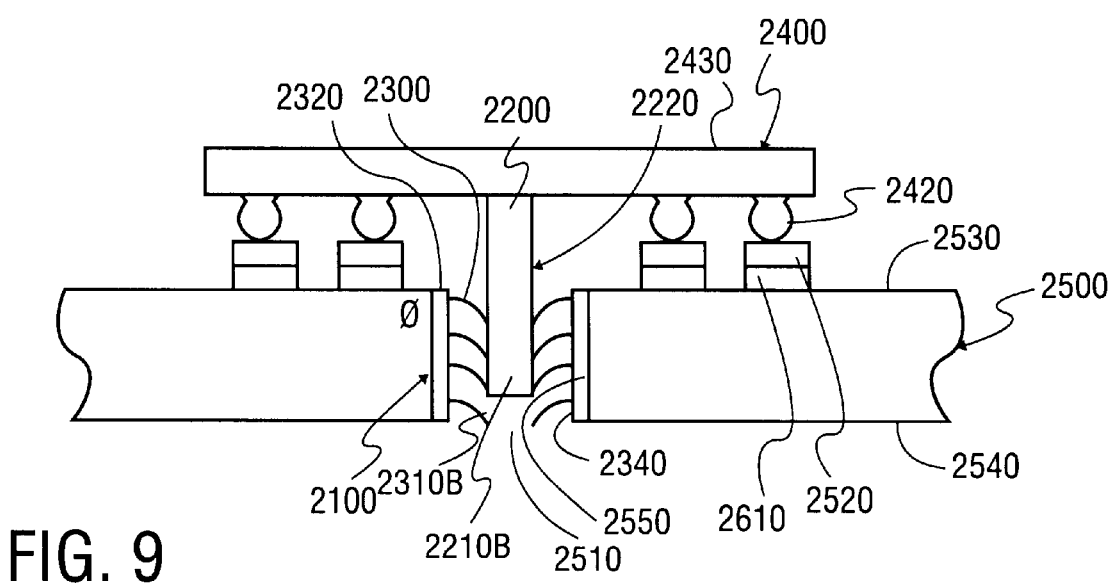
FIG. 9 illustrates the retainer of FIG. 8 after the component has been positioned onto the double-sided printed circuit board.

If solder reflow is to be used to assemble the component 2400, solder paste 2610 is applied to each relevant mounting surface 2520 prior to placement. When the component 2400 is properly positioned onto the printed circuit board 2500, the distal end region 2210b of the retainer member 2200 is in axial alignment with and received by the opening 2510. In one embodiment, the distal end region extends completely through the opening 2510. In an alternative embodiment, the distal end region 2210b is disposed within the opening 2510, as shown in FIG. 9, and is recessed within the opening 2510 by at least 0.010 inches.

Since the retainer 2100 has a cross-section (not shown) that is greater than or equal to a spacing between opposing distal end regions 2310b, the circumference 2220 of the retainer member 2200 contacts the distal end regions 2310b and compresses the bristles 2300. As the bristles 2300 resist the compression, the distal end regions 2310b press against and engage the circumference 2220.

In different embodiments, the distal end regions 2310b can engage the circumference 2220 in any manner, such as via an adhesive or frictionally. Additional distal end regions 2310b of the bristles 2300 can engage the circumference 2220 as the distal end region 2210b of the retainer member 2200 continues to be received by the opening 2510 and/or the channel 2350. The distal end regions 2310b continue to engage the circumference 2220 when the component 2400 is properly positioned onto the printed circuit board 2500.

The pre-selected length and/or the pre-selected angle φ of each of the bristles 2300 is suitably chosen to reduce an insertion force to insert the retainer member 2200 into the opening 2510. The selection of the pre-selected length and/or the pre-selected angle φ can depend, at least in part, on the composition of the flexible material and/or the cross-section (not shown) of the bristles 2300.

Once positioned onto the primary side 2530, the component 2400 and any additional components (not shown) are assembled onto the primary side 2530. During assembly, solder connections (not shown) are formed and couple each of the electrical connections 2420 with the relevant mounting surfaces 2520

In one embodiment, the bristle carrier 2320 can be coupled with the inner surface 2550 and/or the retainer member 2200 can be coupled with the component 2400 after the component 2400 has been assembled onto the printed circuit board 2500. To facilitate post-assembly coupling, the retainer member 2220 is coupled with the component 2400 before the bristles 2300 are coupled with the inner surface 2550. Before the bristles 2300 are coupled with the inner surface 2550, the retainer member 2200 can be received by the opening 2510 and coupled with the component package 2430 without interference from the bristles 2300 because the retainer member 2200 is subject to the low insertion force.

Otherwise, the bristles 2300 are pre-compressed by a removable sheath (not shown) having an internal passage (not shown) and an outer surface (not shown). The removable sheath is centrally disposed within the spacing between opposing distal end regions 2310b. The outer surface compresses the bristles 2300. While the bristles 2300 are compressed, the retainer member 2200 passes through the internal passage and approaches the component package 2430, permitting the retainer member 2200 to be coupled with the component package 2430. After the retainer member 2200 is coupled with the component package 2430, the removable sheath can be removed from the bristles 2300, which re-expand and engage the retainer member 2200.

After the component 2400 and the additional components are assembled onto the primary side 2530, the printed circuit board 2500 can be inverted to facilitate the positioning of one or more other components (not shown) onto the secondary side 2540. In one embodiment, during the second convection reflow stage, the printed circuit board 2500, along with the inverted component 2400, the retainer 2100, and the other components, begins to heat. The temperature of these components approaches the solder reflow temperature at which some or all of the solder connections of the inverted component 2400 can liquefy.

Since the retainer member 2200 and the bristles 2300 can withstand decomposition and/or remain functionally stable at temperatures exceeding the typical solder reflow temperatures, the retainer 2100 remains functionally stable during the second convection reflow stage. The engagement between the retainer member 2200 and the bristles 2300 is thereby maintained as some or all of the solder connections associated with the inverted component 2400 liquefy.

In one embodiment, the pre-selected length and/or the pre-selected angle φ can be varied among the bristles 2300. In addition, the circumference 2220 can be treated to enhance the engagement between the distal end regions 2310b and the circumference 2220. The inner surface 2550 can be roughened by any manner known in the art.

Although a single retainer member 2200 has been previously shown and described as being coupled with a component 2400, many retainer members 2200 can be used with the component 2400. Each retainer member 2200 can be formed with differing and/or uniform dimensions and retainer materials and is received by bristles 2300 as described in more detail above. Similarly, the bristles 2300 can extend at differing and/or uniform pre-selected angles φ (shown in FIG. 1*a*) from an inner surface 2550 defining a relevant opening 2510 in the printed circuit board 2500. The bristles 2300 can be formed with differing and/or uniform dimensions and flexible materials.

The retainer member 2200 is coupled with and extends from a component package 2430 of the component 2400 as described above. The distal end regions 2210*b* of the coupling members are equally distributed such that the mass of the component 2400 is equally distributed among the coupling members. The component 2400 is positioned and assembled onto the printed circuit board 2500.

When the component 2400 is properly positioned onto the printed circuit board 2500, the coupling members are in axial alignment with and received by the openings 2510. Each of the bristles 2300 engages the inner surface 2550 defining the relevant opening 2510 and thereby coupling the component 2400 with the printed circuit board 2500.

A retainer and a method for using the same have been described. Although the present invention has been described with reference to specific exemplary embodiments, it will be evident that various modifications and changes may be made to these embodiments without departing from the broader spirit and scope of the invention. Accordingly, the specification and drawings are to be regarded in an illustrative rather than a restrictive sense.

What is claimed is:

1. An electronic assembly comprising:
   a circuit board;
   an electronic component;
   a plurality of electric contacts between the circuit board and the electronic component;
   a retainer having a retainer member attached to the electronic circuit, the retainer member having a circumference; and
   one or more bristles disposed upon the circumference of the retainer member such that, upon insertion of the retainer into an opening of the circuit board, the bristles inhibit movement of the electronic component away from the circuit board when the electric contacts melt.

2. The electronic assembly of claim 1, wherein the one or more bristles are arranged into a plurality of longitudinal columns around the circumference of the retainer member.

3. The electronic assembly of claim 2, wherein the bristles are substantially symmetrically disposed about the circumference of the retainer member.

4. An electronic assembly comprising:
   an electronic component having a retainer member attached thereto;
   a plurality of electric contacts between the electronic component;
   a circuit board connected to the electronic component with a plurality of electric contacts disposed between the electronic component and the circuit board; and
   an opening formed within the circuit board having a circumference with one or more bristles disposed upon the circumference such that, upon insertion of the retainer member into the opening of the circuit board, the bristles inhibit movement of the electronic component away from the circuit board when the electric contacts melt.

5. The electronic assembly of claim 4, wherein the one or more bristles are arranged into a plurality of longitudinal columns around the circumference of the opening.

6. The electronic assembly of claim 5, wherein the bristles are substantially symmetrically disposed about the circumference of the opening.

7. A retainer comprising:
   A retainer member attachable to an electronic circuit, the retainer member having a circumference; and
   one or more bristles disposed upon the circumference of the retainer member such that, upon insertion of the retainer into an opening of a circuit board, the bristles inhibit movement of an electronic component away from the circuit board when a plurality of electric contacts, between the circuit board and the electronic component, melt.

8. The retainer of claim 7, wherein the one or more bristles are arranged into a plurality of longitudinal columns around the circumference of the retainer member.

9. The retainer of claim 8, wherein the bristles are substantially symmetrically disposed about the circumference of the retainer member.

* * * * *

UNITED STATES PATENT AND TRADEMARK OFFICE
CERTIFICATE OF CORRECTION

PATENT NO. : 6,700,800 B2 Page 1 of 1
DATED : March 2, 2004
INVENTOR(S) : Combs et al.

It is certified that error appears in the above-identified patent and that said Letters Patent is hereby corrected as shown below:

<u>Column 7,</u>
Line 2, after "angle", delete "100", insert -- θ --.

Signed and Sealed this

Eighteenth Day of May, 2004

JON W. DUDAS
*Acting Director of the United States Patent and Trademark Office*